United States Patent
Kawagoe et al.

(10) Patent No.: US 10,174,914 B2
(45) Date of Patent: Jan. 8, 2019

(54) LIGHT-EMITTING-ELEMENT MOUNTING SUBSTRATE, LIGHT EMITTING DEVICE, AND LIGHT EMITTING MODULE

(71) Applicant: KYOCERA Corporation, Kyoto-shi, Kyoto (JP)

(72) Inventors: Hiroshi Kawagoe, Kyoto (JP); Masataka Yoshida, Kyoto (JP)

(73) Assignee: KYOCERA Corporation, Kyoto-Shi, Kyoto (JP)

( * ) Notice: Subject to any disclaimer, the term of this patent is extended or adjusted under 35 U.S.C. 154(b) by 0 days.

(21) Appl. No.: 15/575,232

(22) PCT Filed: Aug. 22, 2016

(86) PCT No.: PCT/JP2016/074386
§ 371 (c)(1),
(2) Date: Nov. 17, 2017

(87) PCT Pub. No.: WO2017/033890
PCT Pub. Date: Mar. 2, 2017

(65) Prior Publication Data
US 2018/0163954 A1 Jun. 14, 2018

(30) Foreign Application Priority Data
Aug. 24, 2015 (JP) ................... 2015-164896

(51) Int. Cl.
*F21V 21/00* (2006.01)
*F21V 31/00* (2006.01)
(Continued)

(52) U.S. Cl.
CPC ............... *F21V 21/00* (2013.01); *F21S 2/00* (2013.01); *F21V 17/08* (2013.01); *F21V 31/00* (2013.01);
(Continued)

(58) Field of Classification Search
CPC .................... F21V 21/00; F21V 17/08
(Continued)

(56) References Cited

U.S. PATENT DOCUMENTS 8,833,982 B2 * 9/2014 Funakubo ............... F21V 21/00
313/46
8,876,334 B2 * 11/2014 Chung ................ H01L 25/0753
257/100
(Continued)

FOREIGN PATENT DOCUMENTS

JP     2002-094123 A    3/2002
JP     2011-233645 A   11/2011
(Continued)

OTHER PUBLICATIONS

English Translation of JP 2013/171969, J-Plat Pat, May 13, 2015, pp. 1-21.*
International Search Report, PCT/JP2016/074386, dated Oct. 11, 2016, 2 pgs.

*Primary Examiner* — Laura Tso
(74) *Attorney, Agent, or Firm* — Volpe and Koenig, P.C.

(57) ABSTRACT

A light-emitting-element mounting substrate according to the present invention includes a substrate, a mount portion for mounting a light emitting element on a main surface of the substrate, and a resin frame surrounding the mount portion in plan view and to be in contact with an encapsulant for encapsulating the light emitting element to be mounted. The resin frame includes a recess in a main surface thereof, the recess surrounding the mount portion in plan view.

14 Claims, 12 Drawing Sheets

(51) Int. Cl.
  *F21S 2/00* (2016.01)
  *H01L 23/29* (2006.01)
  *H01L 23/31* (2006.01)
  *H01L 33/00* (2010.01)
  *H01L 33/54* (2010.01)
  *F21V 17/08* (2006.01)

(52) U.S. Cl.
  CPC ............. *H01L 23/29* (2013.01); *H01L 23/31* (2013.01); *H01L 33/00* (2013.01); *H01L 33/54* (2013.01); *H01L 2224/16225* (2013.01)

(58) Field of Classification Search
  USPC ................................. 362/382, 249.02, 311.02
  See application file for complete search history.

(56) References Cited

U.S. PATENT DOCUMENTS

| 2010/0046221 A1* | 2/2010 | Posselt | F21K 9/00 362/249.02 |
| 2013/0077299 A1* | 3/2013 | Hussell | H05B 37/02 362/231 |
| 2013/0193462 A1* | 8/2013 | Ishizaki | F21V 3/00 257/88 |

FOREIGN PATENT DOCUMENTS

| JP | 2013-015176 A | 1/2013 |
| JP | 2013-171969 A | 9/2013 |
| JP | 2014-044970 A | 3/2014 |

* cited by examiner

FIG. 12

LIGHT-EMITTING-ELEMENT MOUNTING SUBSTRATE, LIGHT EMITTING DEVICE, AND LIGHT EMITTING MODULE

TECHNICAL FIELD

The present invention relates to a light-emitting-element mounting substrate, a light emitting device, and a light emitting module.

BACKGROUND ART

Existing light-emitting-element mounting substrates include a substrate, having a mount portion for mounting a light emitting element on a main surface thereof. A light emitting device is formed by mounting the light emitting element on the mount portion of the light-emitting-element mounting substrate and encapsulating the light emitting element with the encapsulant. A light emitting module is produced by connecting the light emitting device to a module substrate (see Japanese Unexamined Patent Application Publication No. 2002-094123).

SUMMARY OF INVENTION

Technical Problem

However, as the luminance of light emitting elements has increased in recent years, if an electric potential is applied to the light emitting module to activate the light emitting device, the light emitting element generates a large amount of heat. The heat is transferred to the encapsulant and causes the encapsulant to expand, and the encapsulant may be easily removed from the light-emitting-element mounting substrate while the light emitting module is used repeatedly.

Solution to Problem

According to an aspect of the present invention, a light-emitting-element mounting substrate includes a substrate, a mount portion for mounting a light emitting element on a main surface of the substrate, and a resin frame surrounding the mount portion in plan view and to be in contact with an encapsulant for encapsulating the light emitting element to be mounted. The resin frame includes a recess in a main surface thereof, the recess surrounding the mount portion in plan view.

According to another aspect of the present invention, a light emitting device includes the light-emitting-element mounting substrate having the structure described above, a light emitting element mounted on the light-emitting-element mounting substrate, and an encapsulant disposed in the recess and encapsulating the light emitting element.

According to another aspect of the present invention, a light emitting module includes the light emitting device having the structure described above, and a module substrate to which the light emitting device is connected.

Advantageous Effects of Invention

A light-emitting-element mounting substrate according to an aspect of the present invention includes a substrate, a mount portion for mounting a light emitting element on a main surface of the substrate, and a resin frame surrounding the mount portion in plan view and to be in contact with an encapsulant for encapsulating the light emitting element to be mounted. The resin frame includes a recess in a main surface thereof, the recess surrounding the mount portion in plan view. With such a structure, even if stress is generated due to thermal expansion of the encapsulant when the light emitting element is encapsulated with the encapsulant and the light emitting device is activated, the stress is dispersed in a part of the resin frame that is adjacent to the recess and protrudes in a direction perpendicular to the main surface of the substrate. As a result, it is possible to suppress removal of the encapsulant from the light-emitting-element mounting substrate due to expansion of the encapsulant in the planar direction.

A light emitting device according to another aspect of the present invention includes the light-emitting-element mounting substrate having the structure described above, a light emitting element mounted on the light-emitting-element mounting substrate, and an encapsulant disposed in the recess and encapsulating the light emitting element. Thus, the light emitting device can efficiently emit light for a long period.

A light emitting module according to another aspect of the present invention includes the light emitting device described above, and a module substrate to which the light emitting device is connected. Thus, the light emitting module can efficiently emit light for a long period.

DESCRIPTION OF EMBODIMENTS

Some exemplary embodiments of the present invention will be described with reference to the drawings.

First Embodiment

As in the example illustrated in FIGS. 2 to 5, a light emitting device 1 according to a first embodiment of the present invention includes a light-emitting-element mounting substrate 1a and a light emitting element 2 disposed on an upper surface of the light-emitting-element mounting substrate 1a. The light emitting device 1 is connected to, for example, connection pads 51 on a module substrate 5 of a light emitting module.

As in the example illustrated in FIGS. 1A to 3B, the light-emitting-element mounting substrate 1a according to the present embodiment includes a substrate 11, a mount portion 11a for mounting the light emitting element 2 on a main surface of the substrate 11, and a resin frame 13 surrounding the mount portion 11a in plan view and to be in contact with an encapsulant 4 for encapsulating the light emitting element 2. The encapsulant 4 is made of, for example, silicone resin, epoxy resin, or the like. The light-emitting-element mounting substrate 1a includes wiring conductors 12 disposed on or in the substrate 11. The resin frame 13 includes a recess 13a formed in a main surface thereof, the recess 13a surrounding the mount portion 11a in plan view. In FIGS. 1A to 3B, the light-emitting-element mounting substrate 1a and the light emitting device 1 are mounted on the xy-plane of an imaginary xyz-space. In FIGS. 1A to 3B, the upward direction is the positive direction along an imaginary z-axis. In the following description, the distinction between "upper" and "lower" is used only for convenience of description and does not limit "upper" and "lower" when the light-emitting-element mounting substrate 1a and the like are actually used.

The substrate 11 has a first main surface (upper surface in FIGS. 1A to 3B) and a second main surface (lower surface in FIGS. 1A to 3B). The substrate 11 includes one or more insulating layers and has a rectangular plate-like shape in plan view. The substrate 11 functions as a supporter for supporting the light emitting element 2. For example, the light emitting element 2 of a flip chip type is fixed to the mount portion 11a on the first main surface of the substrate 11 via connection members 3. The connection members 3 are solder bumps, gold bumps, electroconductive resin (anisotropic conductive resin) members, or the like.

As the substrate 11, ceramics, such as aluminum oxide sintered body (alumina ceramics), an aluminum nitride sintered body, a silicon nitride sintered body, a mullite sintered body, or a glass ceramic sintered body, can be used. For example, if the substrate 11 is an aluminum oxide sintered body, the substrate 11 is produced as follows. Slurry is made by mixing material powder composed of, for example, aluminum oxide ($Al_2O_3$), silicon oxide ($SiO_2$), magnesium oxide (MgO), and calcium oxide (CaO); an appropriate organic binder; a solvent; and the like. A ceramic green sheet is made by forming the slurry into a sheet-like shape by using a known method, such as a doctor blade method or a calendar roller method. Next, the ceramic green sheet is punched appropriately, a plurality of such ceramic green sheets is laminated according to need form a green body, and the green body is fired at a high temperature (of about 1600° C.), thereby obtaining the substrate 11.

The wiring conductors 12 electrically connect the light emitting element 2, which is mounted on the light-emitting-element mounting substrate 1a, to the module substrate 5. The wiring conductors 12 include wiring layers disposed on or in the substrate 11, and via-conductors that extend through the substrate 11 and electrically connect wiring layers located at upper and lower positions to each other.

The material of the wiring conductors 12 is a metalized material of metal powder containing, for example, tungsten (W), molybdenum (Mo), manganese (Mn), silver (Ag), or copper (Cu) as a main component. The wiring conductors 12 are formed by, for example, applying a paste for metallization to form the wiring conductors 12 to a ceramic green sheet for the substrate 11 by using a printing method such as screen printing, and firing the paste for metallization to form the wiring conductors 12 and the ceramic green sheet for the substrate 11. The via-conductors are formed by, for example, forming through-holes for the via-conductors by punching the ceramic green sheet for the substrate 11, for example, with a die or by laser processing; filling the through-holes with another paste for metallization to form the via-conductors by using the aforementioned printing method; and by firing the metallized paste for the through-holes and the ceramic green sheet for the substrate 11. The pastes are each produced by mixing the aforementioned metal powder with an appropriate solvent and a binder and by adjusting the viscosity of the mixture to an appropriate viscosity. The pastes may include glass powder or ceramic powder in order to increase the strength of joints between the via-conductors and the substrate 11.

Metal plating layers are formed on surfaces of the wiring conductors 12 exposed from the substrate 11. The metal plating layers are made of a metal having high corrosion resistance, such as nickel or gold. The metal plating layers can suppress corrosion of the wiring conductors 12 and can increase the strength of joints between the wiring conductors 12 and the light emitting element 2, connections between the wiring conductors 12 and the connection members 3, or joints between the module substrate 5 and the wiring conductors 12. For example, a nickel plating layer having a thickness of about 1 to 10 μm and a gold plating layer having a thickness of about 0.1 to 3 μm are successively formed on the surfaces of the wiring conductors 12 exposed from the substrate 11.

Each of the metal plating layers is not limited to a combination of nickel plating layer/gold plating layer and may be another combination of metal layers, such as nickel plating layer/gold plating layer/silver plating layer or nickel plating layer/palladium plating layer/gold plating layer.

The resin frame 13 is disposed on the first main surface of the substrate 11 so as to surround the light emitting element 2 mounted on the mount portion 11a. In the example illustrated in FIGS. 1A and 2, the resin frame 13 has an annular shape in plan view. The resin frame 13 is disposed in such a way that the resin frame 13 comes into contact with the encapsulant 4 when disposing the encapsulant 4 inside of the resin frame 13 so as to cover the light emitting element 2. The resin frame 13 holds the encapsulant 4 and reflects light emitted from the light emitting element 2. Preferably, the resin frame 13 is made of a white material such as phenolic resin, epoxy resin, silicone resin and has higher reflectance for light emitted from the light emitting element 2 than the substrate 11. Preferably, the resin frame 13 has higher reflectance for light emitted from the light emitting element 2 than the metal plating layers formed on the surfaces of the wiring conductors 12. If the light emitting device 1 is activated and heat is transferred from the light emitting element 2, thermal expansion of the resin frame 13 in the planar direction is substantially same as thermal expansion of the substrate 11, on which the resin frame 13 is disposed and which has a considerably greater thickness than the resin frame 13.

The resin frame 13 includes the recess 13a in a main surface thereof, the recess 13a surrounding the mount portion 11a in plan view. With such a structure, even if stress is generated due to thermal expansion of the encapsulant 4 when the light emitting element 2 is encapsulated with the encapsulant 4 and the light emitting device 1 is activated, the stress is dispersed in a part of the resin frame 13 that is adjacent to the recess 13a and that protrudes in a direction perpendicular to the main surface of the substrate 11. As a result, it is possible to suppress removal of the encapsulant 4 from the light-emitting-element mounting substrate 1a due to expansion of the encapsulant 4 in the planar direction. The resin frame 13 can be produced by, for example, forming the recess 13a in the main surface of the resin frame 13 when forming the resin frame 13 on the main surface of the substrate 11 so as to surround the mount portion 11a. For example, the resin frame 13 can be formed by applying a paste for the resin frame 13 having the recess 13a to the main surface of the substrate 11 and by curing the resin frame 13 with heat.

The resin frame 13 may include a protrusion 13b between the mount portion 11a and the recess 13a and a protrusion 13b between the recess 13a and the outer edge of the substrate 11. Each of the protrusions 13b is strip-shaped in plan view and protrudes in a direction perpendicular to the main surface of the substrate 11. With such a structure, even if stress is generated due to thermal expansion of the encapsulant 4 when the light emitting element 2 is encapsulated with the encapsulant 4 and the light emitting device 1 is activated, stress in the planar direction is effectively dispersed by the protrusions 13b, which are strip-shaped in plan view, which are positioned between the mount portion 11a and the recess 13a and between the recess 13a and the outer edge of the substrate 11, and which protrude in the direction perpendicular to the main surface of the substrate 11. As a result, it is possible to suppress removal of the encapsulant 4 from the light-emitting-element mounting substrate 1a due to expansion of the encapsulant 4 in the planar direction.

Figure 1A:
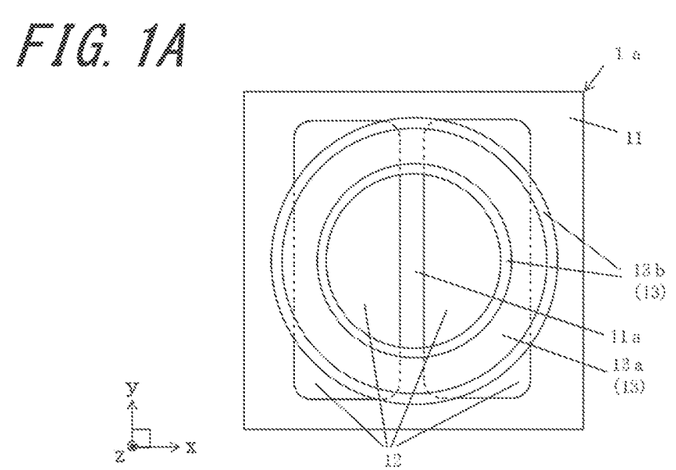
FIG. 1A is a top view of a light-emitting-element mounting substrate according to a first embodiment of the present invention.
Figure 1B:
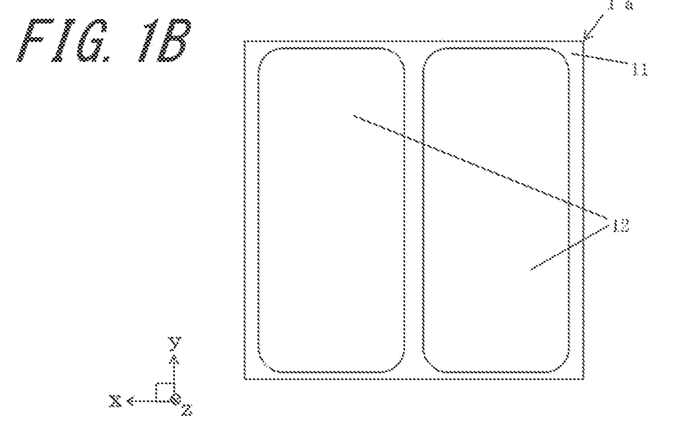
FIG. 1B is a bottom view of FIG. 1A.
Figure 2:
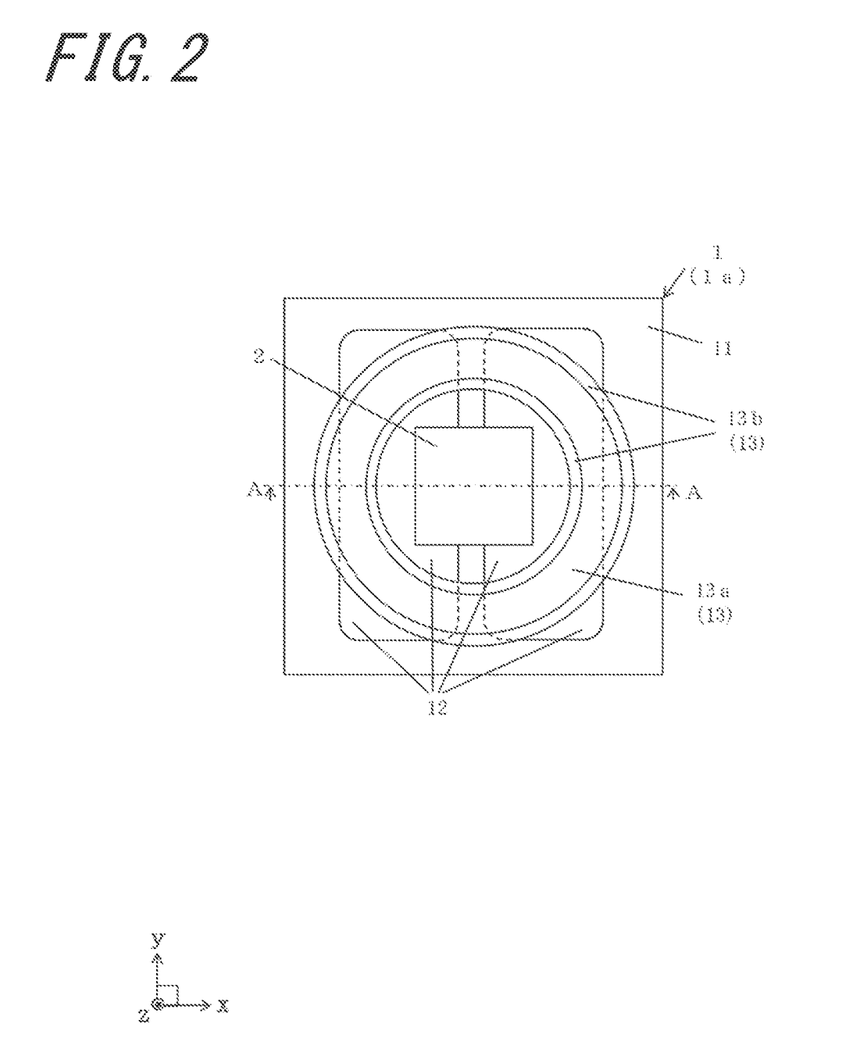
FIG. 2 is a top view of a light emitting device including the light-emitting-element mounting substrate illustrated in FIGS. 1A and 1B, from which an encapsulant is omitted.
Figure 4:
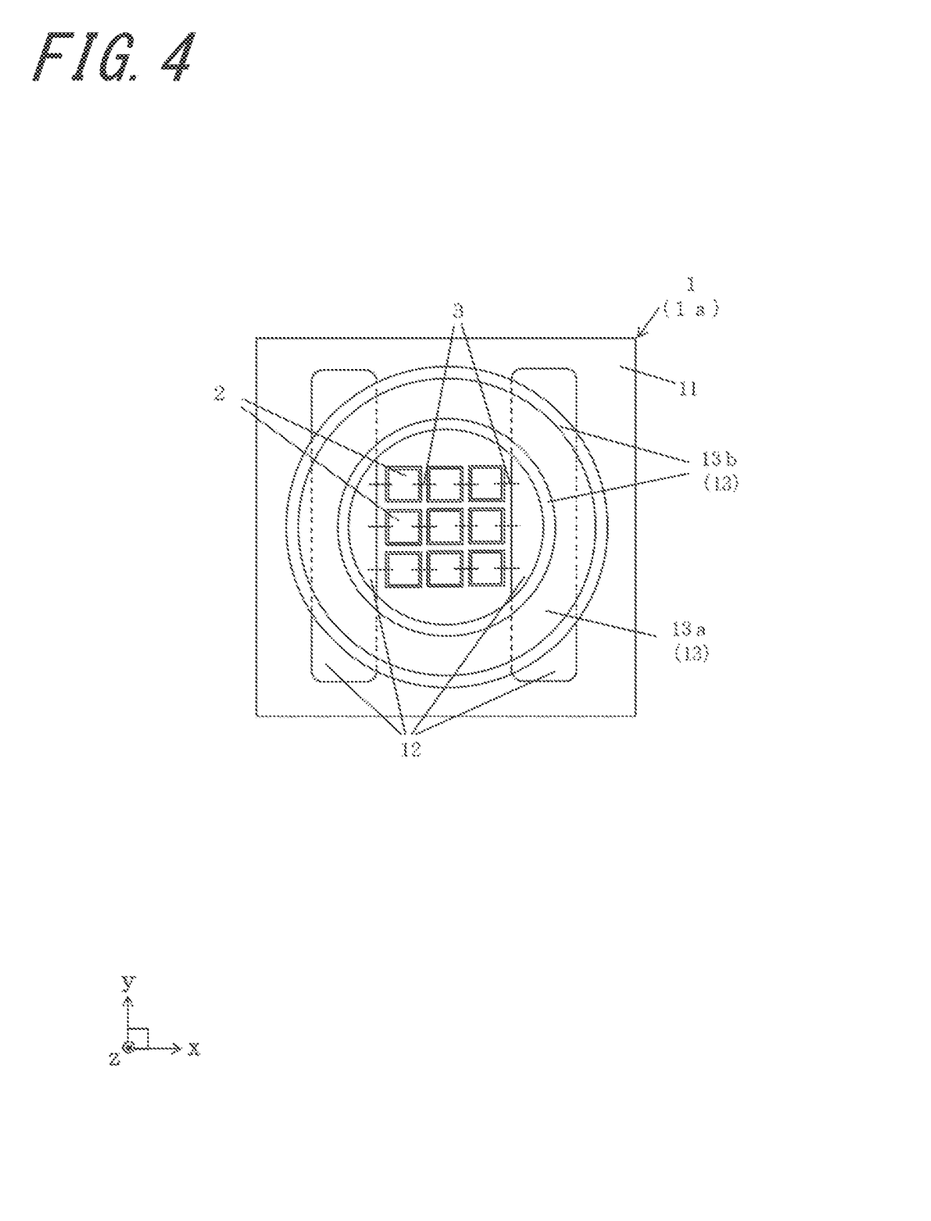
FIG. 4 is a top view of another example of a light emitting device according to the first embodiment of the present invention, from which an encapsulant is omitted.

As in the example illustrated in FIGS. 1A, 2, and 4, each of the protrusions 13b may surround the mount portion 11a. In the example illustrated in FIGS. 1A, 2, and 4, the protrusions 13b are respectively disposed along the inner edge and the outer edge of the resin frame 13 and have annular shapes. With such a structure, even if stress is generated due to thermal expansion of the encapsulant 4 when the light emitting element 2 is encapsulated with the encapsulant 4 and the light emitting device 1 is activated, the stress is uniformly dispersed easily by the protrusions 13b, which surround the mount portion 11a. As a result, it is possible to more effectively suppress removal of the encapsulant 4 from the light-emitting-element mounting substrate 1a due to expansion of the encapsulant 4 in the planar direction.

Figure 3A:
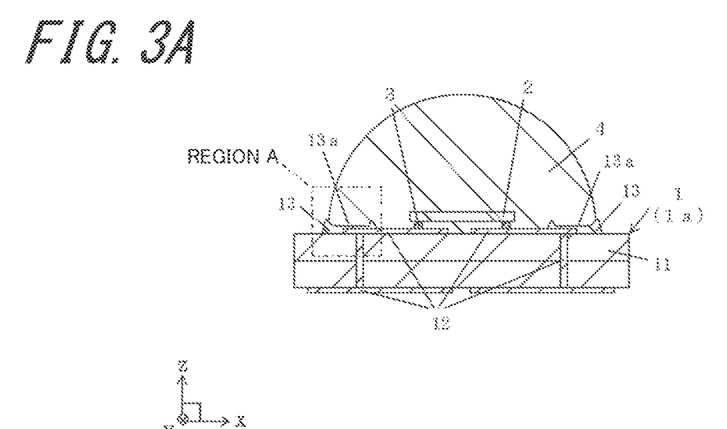
FIG. 3A is a longitudinal sectional view of the light emitting device illustrated in FIG. 2, including an encapsulant, taken along line A-A.
Figure 3B:
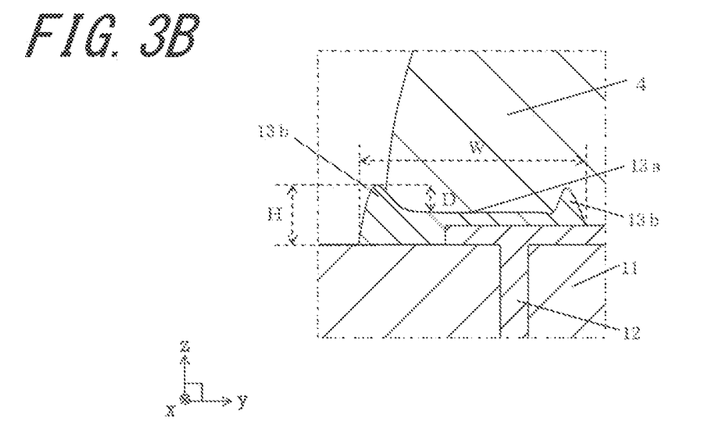
FIG. 3B is a partial enlarged longitudinal sectional view illustrating a region A of FIG. 3A.
Figure 5:
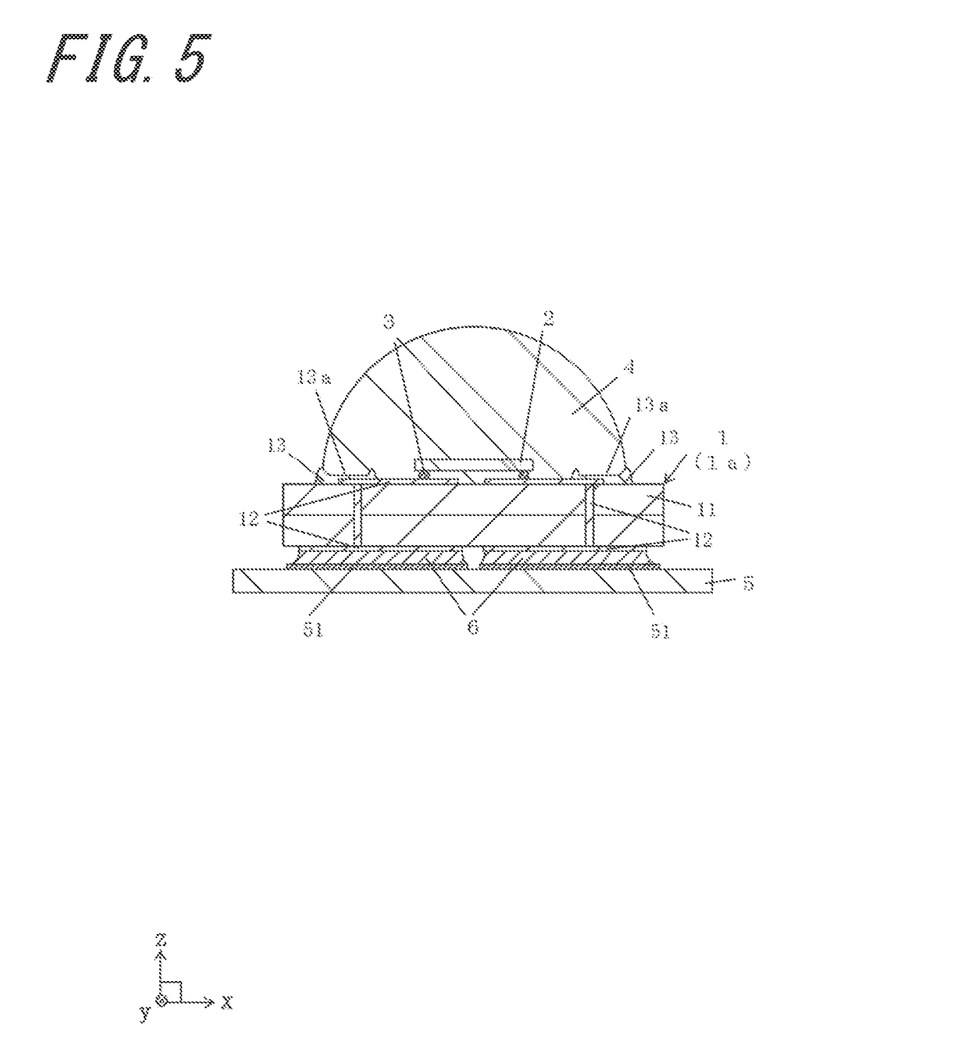
FIG. 5 is a longitudinal sectional view of a light emitting module in which the light emitting device illustrated in FIG. 2, including an encapsulant, is connected to a module substrate.

As in the example illustrated in FIGS. 3A, 3B and 5, the resin frame 13 may be disposed in such a way that the protrusions 13b of the resin frame 13 are in contact with an end portion of the encapsulant 4. In this case, even if stress is generated due to thermal expansion of the encapsulant 4 when the light emitting element 2 is encapsulated with the encapsulant 4 and the light emitting device 1 is activated, stress in the planar direction is dispersed as a whole by the protrusions 13b of the resin frame 13. As a result, it is possible to more effectively suppress removal of the encapsulant 4 from the light-emitting-element mounting substrate 1a due to expansion of the encapsulant 4 in the planar direction.

If the width of the resin frame 13 is greater than the height H of the resin frame 13 (W>H) as in the example illustrated in FIG. 3B, the recess 13a can be easily and appropriately formed in the main surface of the resin frame 13. Preferably, the depth D of the recess 13a is in the range of about $0.2H \leq D \leq 0.8H$, where H is the height of the resin frame 13.

If the height H of the resin frame 13 is lower than the light emitting element 2, the light emitting device 1 can efficiently emit, in all directions, light that is emitted from the upper surface of the light emitting element 2. If the height H of the resin frame 13 is positioned above the upper surface of the light emitting element 2 mounted on the mount portion 11a, the light emitting device 1 can emit light from the light emitting element 2 upward by reflecting the light with a side surface of the resin frame 13.

The resin frame 13 may be placed on the substrate 11 before forming the metal plating layers described above or after forming the metal plating layers. Preferably, the resin frame 13 is formed after forming the metal plating layers for the following reason: contact of the resin frame 13 with a process liquid, such as a plating solution, is suppressed when forming the metal plating layers; and therefore the resin frame 13 can have a good surface condition, and the substrate 11 and the resin frame 13 can be firmly bonded to each other or the resin frame 13 and the encapsulant 4 can be firmly bonded to each other in the light emitting device 1.

The light emitting device 1 is produced by mounting the light emitting element 2 on the mount portion 11a on the first main surface of the light-emitting-element mounting substrate 1a. For example, if the light emitting element 2 is a light emitting element of a flip chip type, the light emitting element 2 is mounted on the light-emitting-element mounting substrate 1a by electrically and mechanically connecting electrodes of the light emitting element 2 to the wiring conductors 12 via the connection members 3. The connection members 3 are solder bumps, gold bumps, electroconductive resin (anisotropic conductive resin) members, or the like. For example, if the light emitting element 2 is a light emitting element of a wire bonding type, the light emitting element 2 is mounted on the light-emitting-element mounting substrate 1a by being fixed to the mount portion 11a via a joining member such as a low-temperature brazing alloy or an electroconductive resin, and then electrically and mechanically connecting the electrodes of the light emitting element 2 to the wiring conductors 12 via the connection members 3 such as bonding wires. As in the example illustrated in FIG. 3A, 3B, the light emitting element 2 is encapsulated by the encapsulant 4 made of a resin. The encapsulant 4 is disposed so as to be in contact with the resin frame 13 along the entire perimeter and disposed in the recess 13a along the entire perimeter of the resin frame 13. As in the example illustrated in FIG. 4, a plurality of light emitting elements 2 may be mounted on the light-emitting-element mounting substrate 1a. As necessary, another electronic component, such as a Zener diode, may be mounted on the light-emitting-element mounting substrate 1a. In the example illustrated in FIG. 4, the plurality of light emitting elements 2 is encapsulated by the encapsulant 4.

A light emitting module according to the present embodiment includes the light emitting device 1 and the module substrate 5 to which the light emitting device 1 is connected. As in the example illustrated in FIG. 5, the light emitting device 1 is connected to the connection pads 51 of the module substrate 5, which is, for example, a printed circuit board, via joining materials 6 such as solder. If an electric potential is supplied from an external power source to the light emitting module, the light emitting element emits light.

The light-emitting-element mounting substrate 1a according to the present embodiment can suppress removal of the encapsulant 4 from the light-emitting-element mounting substrate 1a due to expansion of the encapsulant 4 in the planar direction. Accordingly, the light-emitting-element mounting substrate 1a according to the present embodiment can be appropriately used in the light emitting device 1 of high power, and the reliability of the light-emitting-element mounting substrate 1a can be improved.

The light emitting device 1 according to the present embodiment includes the light-emitting-element mounting substrate 1a having the structure described above, the light emitting element 2 mounted on the light-emitting-element mounting substrate 1a, and the encapsulant 4 disposed in the recess 13a and encapsulating the light emitting element 2. Therefore, removal of the encapsulant 4 from the light-emitting-element mounting substrate 1a can be suppressed, and the light emitting device 1 can efficiently emit light for a long period.

The light emitting module according to the present embodiment includes the light emitting device 1 having the structure described above, and the module substrate 5 to which the light emitting device 1 is connected. Therefore, removal of the encapsulant 4 from the light-emitting-element mounting substrate 1a can be suppressed, and the light emitting module can efficiently emit light for a long period.

Second Embodiment

Next, referring to FIGS. 6A to 8B, a light emitting device 1 according to a second embodiment of the present invention will be described.

The light emitting device 1 according to the second embodiment of the present invention differs from the light emitting device 1 according to the embodiment described above in the shapes of the outer edge and the inner edge of the resin frame 13 as in the example illustrated in FIGS. 6A to 8B. In the example illustrated in FIGS. 6A to 8B, the outer edge of the resin frame 13 is circular, and the inner edge of the resin frame 13 is rectangular in plan view.

With the light-emitting-element mounting substrate 1a according to the second embodiment of the present invention, as with the first embodiment, even if stress is generated due to thermal expansion of the encapsulant 4 when the light emitting element 2 is encapsulated with the encapsulant 4 and the light emitting device 1 is activated, the stress is dispersed in a part of the resin frame 13 that is adjacent to the recess 13a and that protrudes in a direction perpendicular to the main surface of the substrate 11. As a result, it is possible to suppress removal of the encapsulant 4 from the light-emitting-element mounting substrate 1a due to expansion of the encapsulant 4 in the planar direction.

Figure 6A:
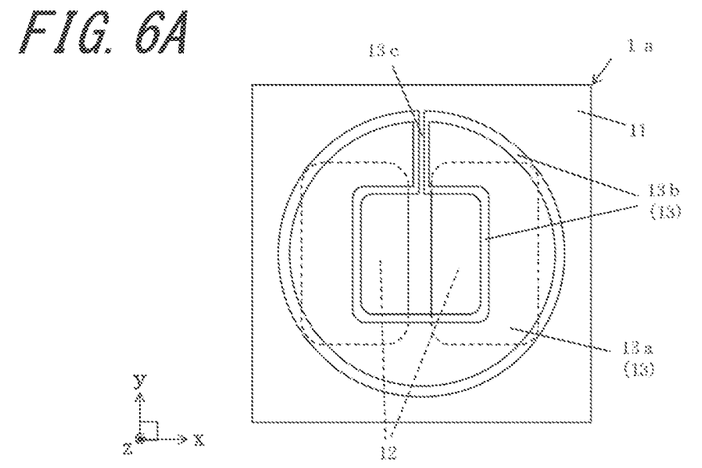
FIG. 6A is a top view of a light-emitting-element mounting substrate according to a second embodiment of the present invention.
Figure 6B:
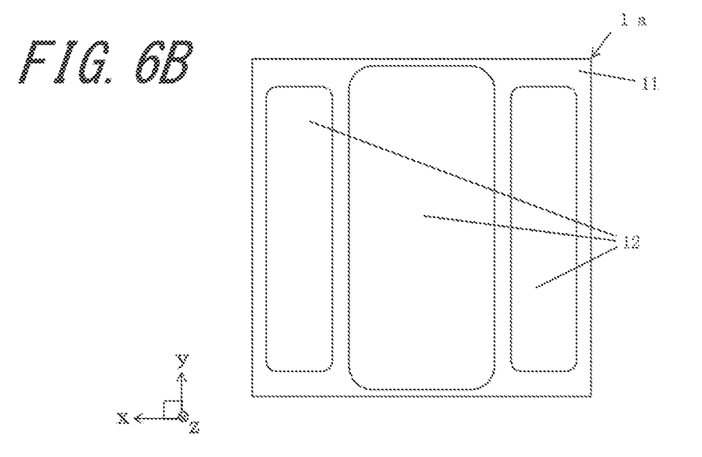
FIG. 6B is a bottom view of FIG. 6A.
Figure 7:
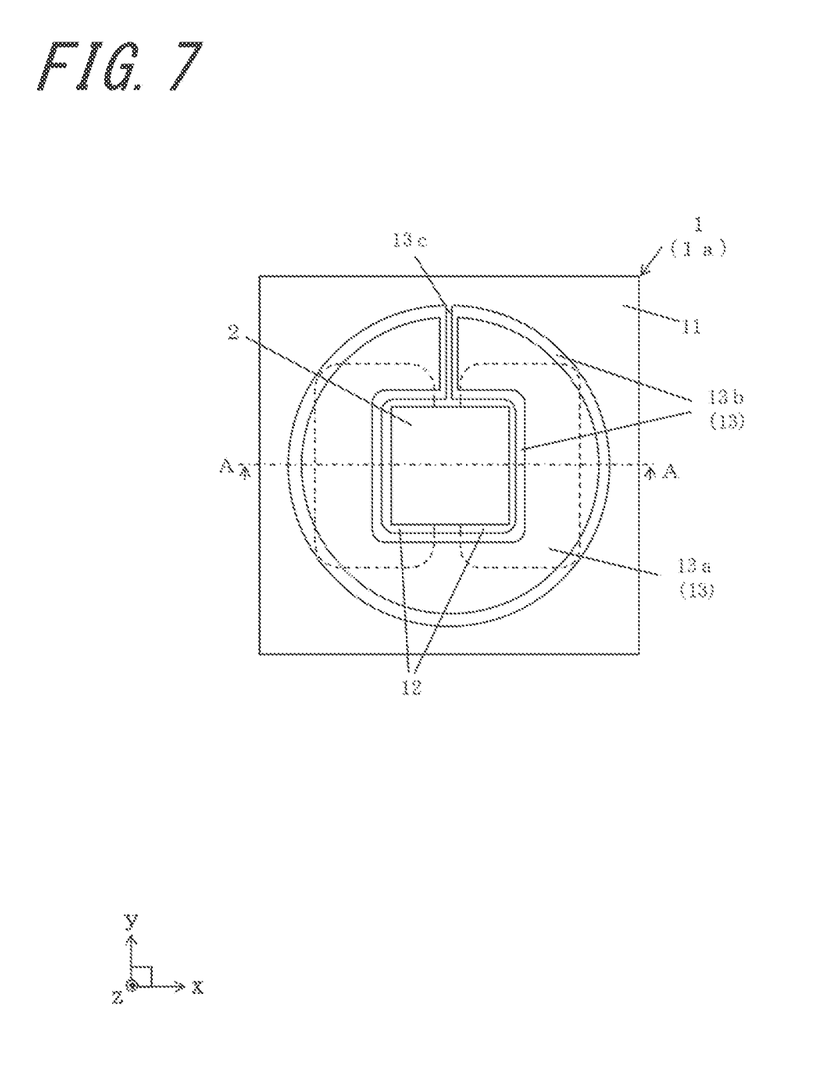
FIG. 7 is a top view of a light emitting device including the light-emitting-element mounting substrate illustrated in FIGS. 6A and 6B, from which an encapsulant is omitted.
Figure 8A:
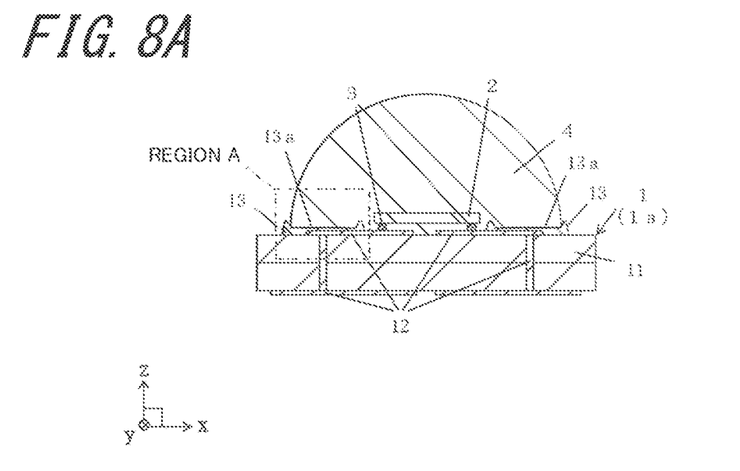
FIG. 8A is longitudinal sectional view of the light emitting device illustrated in FIG. 7, including an encapsulant, taken along line A-A.
Figure 8B:
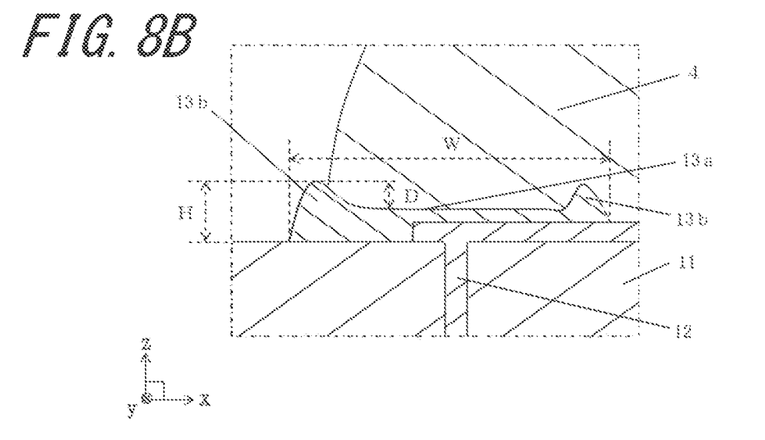
FIG. 8B is a partial enlarged longitudinal sectional view illustrating a region A of FIG. 8A.

In the light-emitting-element mounting substrate 1a according to the second embodiment, for example, the inner edge of the resin frame 13 may extend along the outer edge of the light emitting element 2 (mount portion 11a) in plan view as in the example illustrated in FIGS. 6A and 7. In this case, the light emitting element 2 can be appropriately mounted on the mount portion 11a of the light-emitting-element mounting substrate 1a, the exposed portions of the substrate 11 or the wiring conductors 12 can be made smaller inside the resin frame 13 in plan view, and light from the light emitting element 2 can be appropriately reflected by the resin frame 13; and the light emitting device 1 can emit light efficiently.

Preferably, as in the first embodiment, the width of the resin frame 13 in the narrowest region is greater than the height H of the resin frame 13.

As in the example illustrated in FIGS. 6A and 7, the resin frame 13 may include a passage 13c that continuously connects the inside and the outside of the resin frame 13 in plan view. With such a structure, if disposing the encapsulant 4 in the region surrounded by the resin frame 13, the encapsulant 4 can be injected through the passage 13c, in which the resin frame 13 is not present, or bubbles inside of the resin frame 13 can be discharged to the outside through the passage 13c. Therefore, the light emitting element 2 can be appropriately encapsulated, and the light emitting device 1 can efficiently emit light from the light emitting element 2 to the outside. As in the example illustrated in FIGS. 6A and 7, even when the passage 13c is formed in a region where the width of the resin frame 13 is large, if disposing the encapsulant 4 in the region surrounded by the resin frame 13, the encapsulant 4 can be injected through the passage 13c, in which the resin frame 13 is not present. Therefore, the light emitting element 2 can be appropriately encapsulated, and the light emitting device 1 can efficiently emit light from the light emitting element 2 to the outside.

The resin frame 13 may be formed, for example, beforehand so as to have the passage 13c when forming the resin frame 13 on the main surface of the substrate 11. Alternatively, after forming the resin frame 13 having a circular, a part of the resin frame 13 corresponding to the passage 13c may be removed so as to continuously connect the inside and the outside of the resin frame 13. If the resin frame 13 having the passage 13c is formed beforehand, the protrusions 13b can be easily formed along the passage 13c as in the example illustrated in FIGS. 6A and 7, the encapsulant 4 can be appropriately injected to the inside of the resin frame 13 or bubbles inside of the resin frame 13 can be appropriately discharged to the outside, and the light emitting device 1 can efficiently emit light from the light emitting element 2 to the outside.

If the passage 13c is formed in a region in which the wiring conductors 12 are not exposed as in the example illustrated in FIGS. 6A and 7, steps or the like due to the wiring conductors 12 are not formed in the passage 13c. Therefore, injection of the encapsulant 4 or discharge of bubbles inside of the resin frame 13 to the outside can be efficiently performed.

The light-emitting-element mounting substrate 1a according to the second embodiment can be manufactured by using a method similar to the method of forming the light-emitting-element mounting substrate 1a according to the first embodiment.

Third Embodiment

Next, referring to FIGS. 9A to 10, a light emitting device 1 according to a third embodiment of the present invention will be described.

Figure 9A:
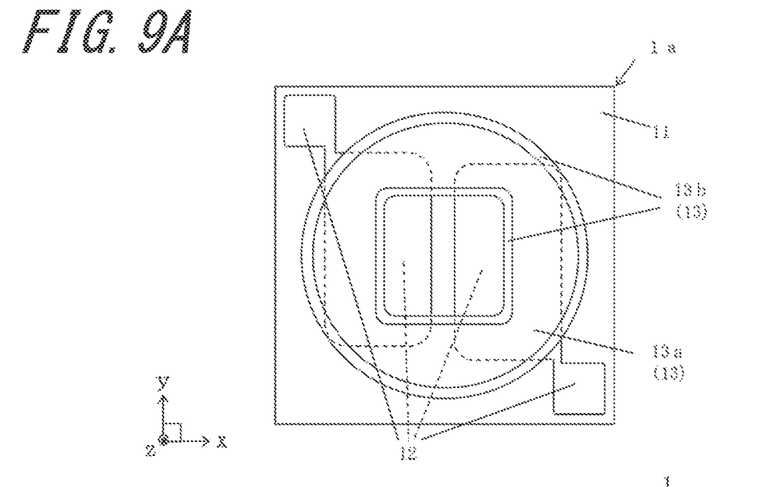
FIG. 9A is a top view of a light-emitting-element mounting substrate according to a third embodiment of the present invention.
Figure 9B:
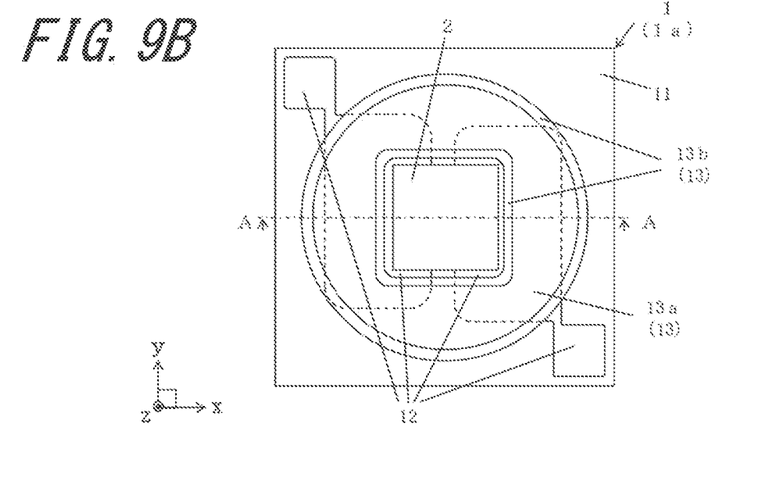
FIG. 9B is a top view of a light emitting device including the light-emitting-element mounting substrate illustrated in FIG. 9A, from which an encapsulant is omitted.
Figure 10:
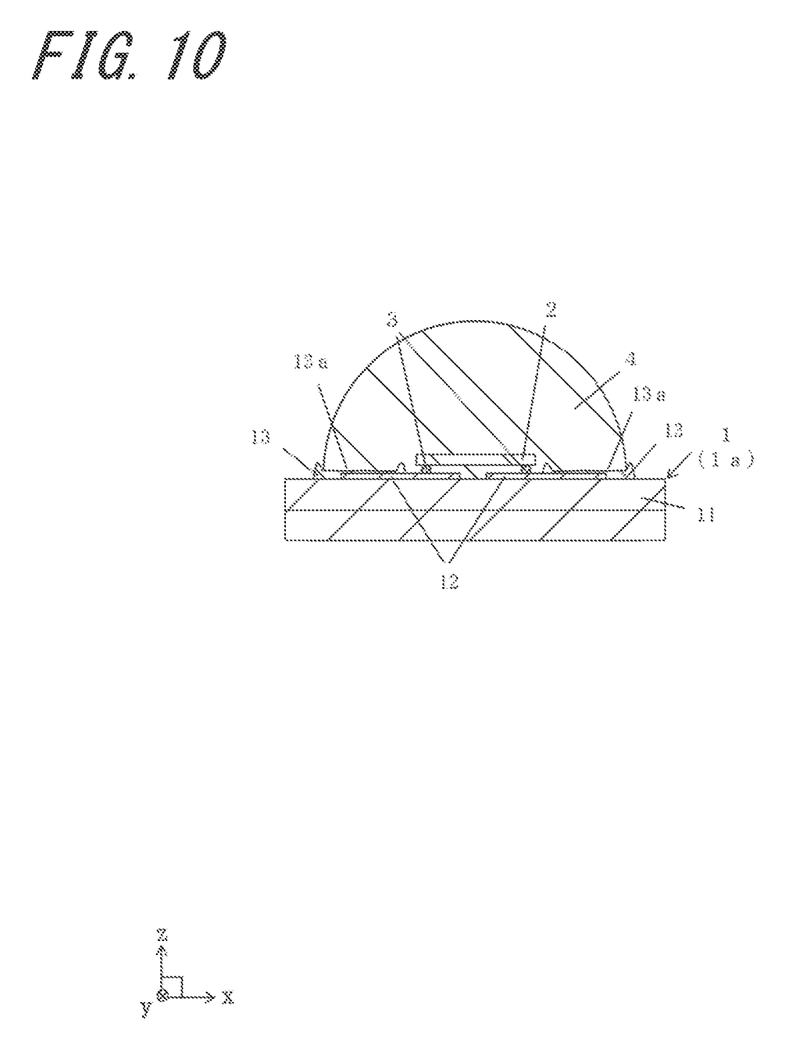
FIG. 10 is a longitudinal sectional view of the light emitting device illustrated in FIG. 9B, including an encapsulant, taken along line A-A.

The light emitting device 1 according to the third embodiment of the present invention differs from the light emitting device 1 according to the embodiments described above in that wiring conductors 12, which are disposed on the main surface of the substrate 11 as with the resin frame 13, extend to end portions of the substrate 11 as in the example illustrated in FIGS. 9A to 10.

With the light-emitting-element mounting substrate 1a according to the third embodiment of the present invention, as with the first embodiment, even if stress is generated due to thermal expansion of the encapsulant 4 when the light emitting element 2 is encapsulated with the encapsulant 4 and the light emitting device 1 is activated, the stress is dispersed in a part of the resin frame 13 that is adjacent to the recess 13a and that protrudes in a direction perpendicular to the main surface of the substrate 11. As a result, it is possible to suppress removal of the encapsulant 4 from the light-emitting-element mounting substrate 1a due to expansion of the encapsulant 4 in the planar direction.

The light-emitting-element mounting substrate 1a according to the third embodiment can be manufactured by using a method similar to the method of forming the light-emitting-element mounting substrate 1a according to the first embodiment.

With the light-emitting-element mounting substrate 1a and the light emitting device 1 according to the third embodiment, a light emitting module is formed by joining the wiring conductors 12, which extend to the end portions of the substrate 11, to the connection pads 51 of the module substrate 5.

Fourth Embodiment

Next, referring to FIG. 11, a light emitting device 1 according to a fourth embodiment of the present invention will be described.

Figure 11:
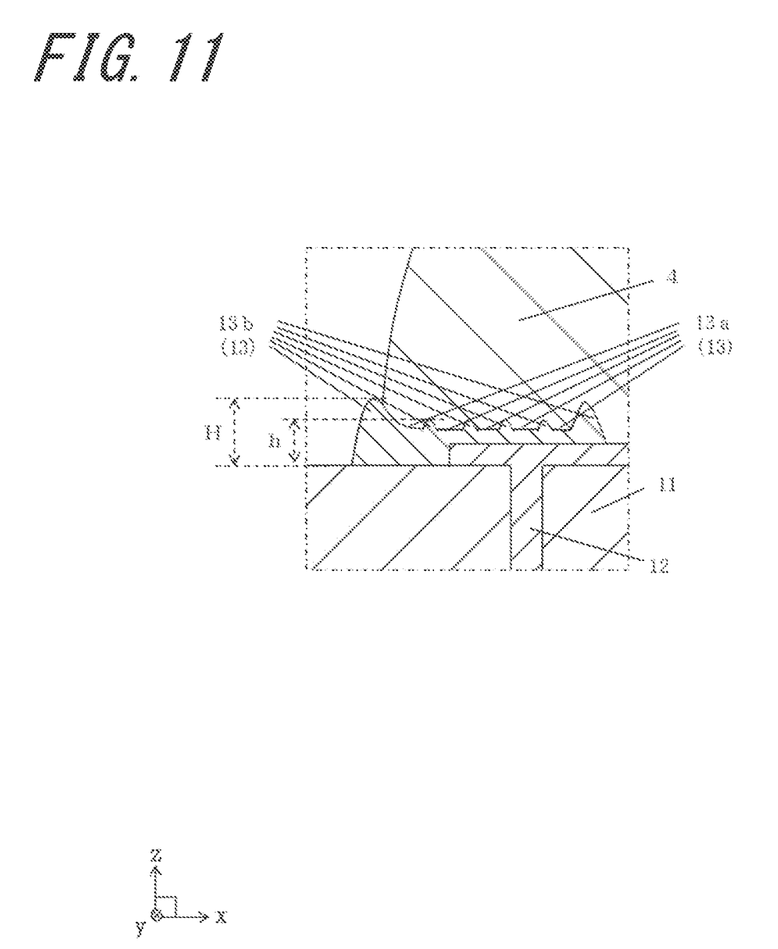
FIG. 11 is a partial enlarged longitudinal sectional view of a light emitting device according to a fourth embodiment of the present invention.

The light emitting device 1 according to the fourth embodiment of the present invention differs from the light emitting device 1 according to the embodiments described above in that the resin frame 13 includes a plurality of recesses 13a in a surface thereof as in the example illustrated in FIG. 11.

With the light-emitting-element mounting substrate 1a according to the fourth embodiment of the present invention, even if stress is generated due to thermal expansion of the encapsulant 4 when the light emitting element 2 is encapsulated with the encapsulant 4 and the light emitting device 1 is activated, the stress is more effectively dispersed in a part of the resin frame 13 that is adjacent to the recess 13a and that protrudes in a direction perpendicular to the main surface of the substrate 11. As a result, it is possible to suppress removal of the encapsulant 4 from the light-emitting-element mounting substrate 1a due to expansion of the encapsulant 4 in the planar direction.

The plurality of recesses 13a is formed, for example, so that each of the recesses 13a surrounds the mount portion 11a in plan view. The height h of protrusions 13b that are not on the outermost side and the innermost side in plan view is smaller than the height H of protrusions 13b that are on the outermost side and the innermost side. The height h is in the range of about 0.3H to 0.7H, and the encapsulant 4 is appropriately injected into each of the recesses 13a along the entire perimeter. The resin frame 13 can be formed by forming the plurality of recesses 13a when forming the resin frame 13 on the substrate 11.

If the plurality of recesses 13a is disposed at regular intervals as in the example illustrated in FIG. 11, the recesses 13a can effectively disperse stress and can suppress removal of the encapsulant 4 from the light-emitting-element mounting substrate 1a due to expansion of the encapsulant 4 in the planar direction.

The plurality of protrusions 13b is disposed between the recesses 13a, for example, at a regular pitch and in annular shapes in plan view.

The resin frame 13 can be produced by, for example, applying a paste for the resin frame 13 so as to form the plurality of recesses 13a in a surface thereof when forming the resin frame 13 on the main surface of the substrate 11.

Protrusions 13b between adjacent recesses 13a may each have an open region in an annular part thereof so as to be divided and disposed on the surface of the resin frame 13 so that the adjacent recesses 13a are partially connected to each other. In this case, the encapsulant 4 on the surface of the resin frame 13 can smoothly move between the adjacent recesses 13a, the resin can be appropriately disposed in the plurality of recesses 13a, and the resin frame 13 and the encapsulant 4 can be firmly bonded to each other. Preferably, the regions where the adjacent recesses 13a are connected to each other are disposed at a regular pitch.

The light-emitting-element mounting substrate 1a according to the fourth embodiment can be manufactured by using a method similar to the method of forming the light-emitting-element mounting substrate 1a according to the first embodiment.

Fifth Embodiment

Next, referring to FIG. 12, a light emitting device 1 according to a fifth embodiment of the present invention will be described.

Figure 12:
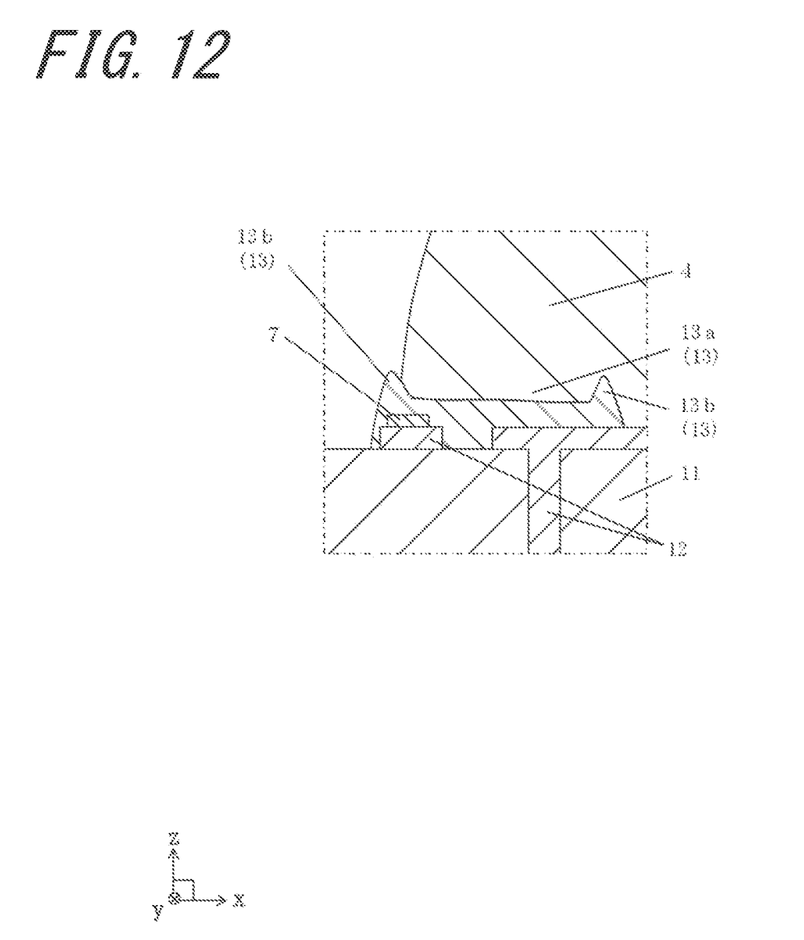
FIG. 12 is a partial enlarged longitudinal sectional view of a light emitting device according to a fifth embodiment of the present invention.

The light emitting device 1 according to the fifth embodiment of the present invention differs from the light emitting device 1 according to the embodiments described above in that another electronic component 7, such as a Zener diode, is embedded between the substrate 11 and the resin frame 13 as in the example illustrated in FIG. 12.

With the light-emitting-element mounting substrate 1a according to the fifth embodiment of the present invention, light emitted from the light emitting element 2 is not blocked by the other electronic component 7. Moreover, it is not necessary to provide a mounting region for the other electronic component 7, and therefore the size of the light emitting device 1 can be reduced.

The light-emitting-element mounting substrate 1a according to the fifth embodiment can be formed by mounting the other electronic component 7 on the substrate 11 and then disposing the resin frame 13 on the main surface of the substrate 11 so as to cover the other electronic component 7. As in the example illustrated in FIG. 12, the thickness of the resin frame 13 is greater than that of the other electronic component 7.

With the light-emitting-element mounting substrate 1a according to the fifth embodiment of the present invention, as in the first embodiment, even if stress is generated due to thermal expansion of the encapsulant 4 when the light emitting element 2 is encapsulated with the encapsulant 4 and the light emitting device 1 is activated, the stress is dispersed in a part of the resin frame 13 that is adjacent to the recess 13a and that protrudes in a direction perpendicular to the main surface of the substrate 11. As a result, it is possible to suppress removal of the encapsulant 4 from the light-emitting-element mounting substrate 1a due to expansion of the encapsulant 4 in the planar direction.

The light-emitting-element mounting substrate 1a according to the fifth embodiment can be manufactured by using a method similar to the method of forming the light-emitting-element mounting substrate 1a according to the first embodiment.

The present invention is not limited to the embodiments described above, and various modifications are possible. For example, each of the wiring conductors 12, which extends to the first main surface or the second main surface of the substrate 11, may be a so-called castellation conductor. That is, the wiring conductor 12 may extend to an inner surface of a hole that is formed between a side surface and the second main surface of the substrate 11 or between a side surface and the first main surface of the substrate 11.

Configurations of the light-emitting-element mounting substrates 1a according to the first to fifth embodiments may be used in combination. For example, a plurality of light emitting elements 2 may be mounted in the light emitting device 1 including the light-emitting-element mounting substrate 1a according to any of the second to fifth embodiments. In the light-emitting-element mounting substrate 1a according to the third embodiment, the inner edge of the resin frame 13 may be circular in plan view as in the light-emitting-element mounting substrate 1a according to the first embodiment.

The invention claimed is:

1. A light-emitting-element mounting substrate comprising:
    a substrate;
    a mount portion for mounting a light emitting element on a main surface of the substrate; and
    a resin frame surrounding the mount portion in plan view and in contact with an encapsulant for encapsulating the light emitting element to be mounted, wherein the resin frame comprises:
        a recess in a main surface thereof, the recess surrounding the mount portion in plan view,
        a first protrusion located between the mount portion and the recess that protrudes in a direction perpendicular to the main surface, and
        a second protrusion located between the recess and an outer edge of the substrate that protrudes in the direction perpendicular to the main surface, wherein a height of the second protrusion from the main surface is greater than a height of the first protrusion from the main surface.

2. The light-emitting-element mounting substrate according to claim 1,
    wherein, each of the first protrusion and the second protrusion is strip-shaped in plan view.

3. The light-emitting-element mounting substrate according to claim 2,
    wherein each of the first protrusion and the second protrusion surrounds the mount portion.

4. The light-emitting-element mounting substrate according to claim 1,
    wherein an inner edge of the resin frame extends along an outer edge of the mount portion in plan view.

5. The light-emitting-element mounting substrate according to claim 1,
    wherein the resin frame comprises a cutout which is opened at outer and inner peripheries thereof.

6. A light emitting device comprising:
    the light-emitting-element mounting substrate according to claim 1;
    a light emitting element mounted on the light-emitting-element mounting substrate; and
    an encapsulant disposed in the recess and encapsulating the light emitting element.

7. The light emitting device according to claim 6,
    wherein the resin frame is disposed in such a way that the first protrusion and the second protrusion are in contact with an end portion of the encapsulant.

8. A light emitting module comprising:
    the light emitting device according to claim 6; and
    a module substrate to which the light emitting device is connected.

9. The light-emitting-element mounting substrate according to claim 2,
    wherein an inner edge of the resin frame extends along an outer edge of the mount portion in plan view.

10. The light-emitting-element mounting substrate according to claim 3,
    wherein an inner edge of the resin frame extends along an outer edge of the mount portion in plan view.

11. The light-emitting-element mounting substrate according to claim 2,
    wherein the resin frame comprises a cutout which is opened at outer and inner peripheries thereof.

12. The light-emitting-element mounting substrate according to claim 3,
    wherein the resin frame comprises a cutout which is opened at outer and inner peripheries thereof.

13. The light-emitting-element mounting substrate according to claim 4,
    wherein the resin frame comprises a cutout which is opened at outer and inner peripheries thereof.

14. A light emitting module comprising:
    the light emitting device according to claim 7; and
    a module substrate to which the light emitting device is connected.

* * * * *